United States Patent
Tsao et al.

(10) Patent No.: US 10,888,020 B2
(45) Date of Patent: Jan. 5, 2021

(54) COOLING SYSTEMS

(71) Applicant: HEWLETT PACKARD ENTERPRISE DEVELOPMENT LP, Houston, TX (US)

(72) Inventors: Chin-Jung Tsao, Taipei (TW); Chih-Sheng Liao, Taipei (TW); Kang-Jong Peng, Taipei (TW); Jui Lin Chen, Taipei (TW); Chao Lin Hsiao, Taipei (TW)

(73) Assignee: Hewlett Packard Enterprise Development LP, Houston, TX (US)

( * ) Notice: Subject to any disclaimer, the term of this patent is extended or adjusted under 35 U.S.C. 154(b) by 619 days.

(21) Appl. No.: 15/496,138

(22) Filed: Apr. 25, 2017

(65) Prior Publication Data
US 2018/0310432 A1    Oct. 25, 2018

(51) Int. Cl.
| F04D 25/16 | (2006.01) |
| H05K 7/20 | (2006.01) |
| H05K 7/14 | (2006.01) |
| F04D 13/12 | (2006.01) |

(Continued)

(52) U.S. Cl.
CPC ......... *H05K 7/20172* (2013.01); *F04D 13/12* (2013.01); *F04D 13/14* (2013.01); *F04D 19/046* (2013.01); *F04D 25/16* (2013.01); *H05K 7/1489* (2013.01); *H05K 7/1491* (2013.01); *H05K 7/20581* (2013.01)

(58) Field of Classification Search
CPC ........... H05K 7/20172; H05K 7/20581; H05K 7/1489; H05K 7/1491; F04D 19/046; F04D 13/14; F04D 13/12; F04D 25/16; F04D 25/166; F04D 29/601; F04D 29/52
See application file for complete search history.

(56) References Cited

U.S. PATENT DOCUMENTS

| 2,108,738 A | * | 2/1938 | Allen | ...................... F04D 25/08 |
| | | | | 417/362 |
| 2,733,002 A | * | 1/1956 | Huck | .................... F04D 29/646 |
| | | | | 417/338 |

(Continued)

FOREIGN PATENT DOCUMENTS

| CN | 202975956 | 6/2012 |
| JP | 5705277 | 2/2015 |
| TW | 201122764 | 7/2011 |

OTHER PUBLICATIONS

European Search Report and Search Opinion Received for EP Application No. 18169045.4, dated Sep. 25, 2018, 8 pages.

*Primary Examiner* — Charles G Freay
*Assistant Examiner* — Thomas Fink
(74) *Attorney, Agent, or Firm* — Nolte Intellectual Property Law Group

(57) ABSTRACT

Examples herein relate to cooling systems. In one example, a cooling system comprises a plurality of adjacent fan modules configured to generate a plurality of cooling flows, a fan cage having a central axis adapted to contain the plurality of adjacent fan modules, the fan cage comprising a cavity on its central axis. Furthermore, the system comprises a first support bracket adapted to support the fan cage such that the fan cage rotates on its central axis and a bush established in the cavity of the fan cage. A first end of the bush is adapted to engage the first support bracket on a first surface of the fan cage.

13 Claims, 7 Drawing Sheets

(51) Int. Cl.
*F04D 13/14* (2006.01)
*F04D 19/04* (2006.01)

(56) References Cited

U.S. PATENT DOCUMENTS

| | | | | |
|---|---|---|---|---|
| 2,830,779 | A * | 4/1958 | Wentling | F04D 29/601 |
| | | | | 248/662 |
| 4,341,151 | A * | 7/1982 | Sakamoto | G01F 5/00 |
| | | | | 454/209 |
| 6,373,698 | B1 * | 4/2002 | Christensen | G06F 1/20 |
| | | | | 174/16.1 |
| 6,682,308 | B1 * | 1/2004 | Fei | F04D 29/403 |
| | | | | 415/213.1 |
| 6,690,576 | B2 | 2/2004 | Clements | |
| 6,752,587 | B2 * | 6/2004 | Lin | F04D 25/166 |
| | | | | 415/220 |
| 6,826,456 | B1 | 11/2004 | Irving et al. | |
| 6,878,874 | B2 | 4/2005 | Osborn | |
| 6,985,358 | B2 | 1/2006 | Thompson | |
| 7,054,155 | B1 * | 5/2006 | Mease | H05K 7/20581 |
| | | | | 165/104.34 |
| 7,406,835 | B2 * | 8/2008 | Allen | F28D 1/0443 |
| | | | | 123/41.02 |
| 7,408,774 | B1 | 8/2008 | Anderl et al. | |
| 7,640,897 | B2 * | 1/2010 | Gandrud | F01P 5/02 |
| | | | | 123/41.49 |
| 8,267,660 | B2 * | 9/2012 | Huang | F04D 25/166 |
| | | | | 361/695 |
| 8,320,120 | B1 | 11/2012 | Chan et al. | |
| 8,631,665 | B1 * | 1/2014 | DeClementi | F25D 7/00 |
| | | | | 415/213.1 |
| 8,830,673 | B2 | 9/2014 | Kuo | |
| 9,017,020 | B2 | 4/2015 | Charest | |
| 9,163,845 | B1 * | 10/2015 | Carlozzi | F24F 7/013 |
| 9,273,857 | B2 * | 3/2016 | Rosenbecker | F04D 25/08 |
| 2005/0260065 | A1 * | 11/2005 | Kikuichi | F04D 25/166 |
| | | | | 415/60 |
| 2007/0076368 | A1 * | 4/2007 | Pike | G06F 1/20 |
| | | | | 361/679.48 |
| 2008/0286114 | A1 * | 11/2008 | Young | F04D 29/601 |
| | | | | 416/244 R |
| 2009/0238690 | A1 * | 9/2009 | Lai | F04D 25/105 |
| | | | | 416/100 |
| 2011/0228476 | A1 * | 9/2011 | Lin | G06F 1/185 |
| | | | | 361/695 |
| 2012/0216993 | A1 * | 8/2012 | Sun | F04D 25/0613 |
| | | | | 165/121 |
| 2012/0267508 | A1 | 10/2012 | Qin | |
| 2013/0109288 | A1 | 5/2013 | Tang | |
| 2013/0315727 | A1 * | 11/2013 | Ho | F04D 25/166 |
| | | | | 415/213.1 |
| 2014/0035405 | A1 * | 2/2014 | Mao | H02K 5/10 |
| | | | | 310/71 |
| 2015/0060014 | A1 | 3/2015 | Ma et al. | |
| 2015/0351280 | A1 | 12/2015 | Gonzalez et al. | |
| 2016/0174409 | A1 | 6/2016 | Mease et al. | |
| 2017/0034953 | A1 | 2/2017 | Chen | |

* cited by examiner

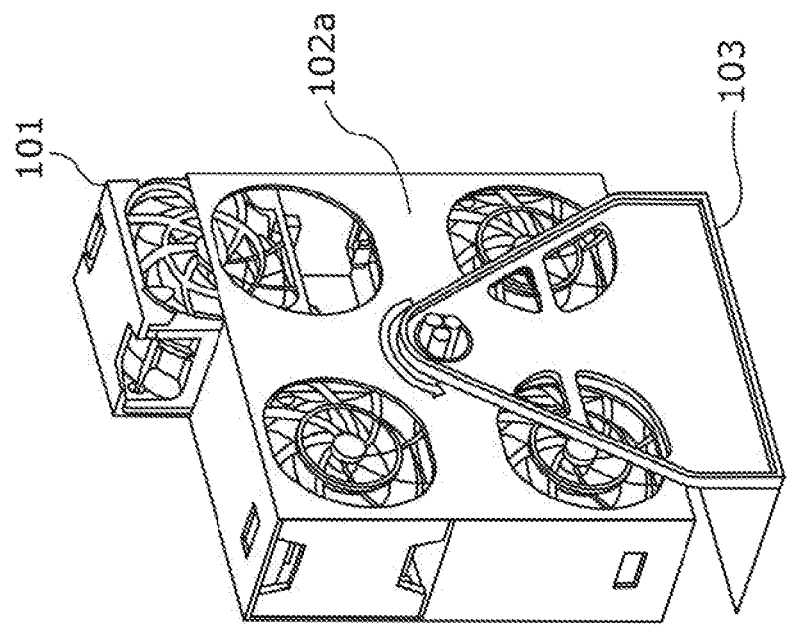
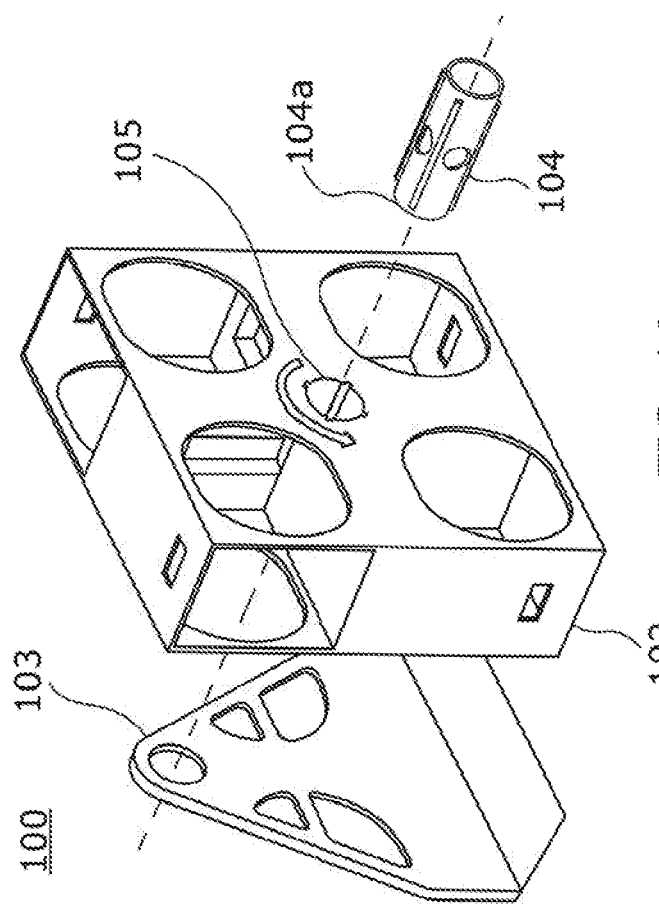
FIG. 1A
FIG. 1B

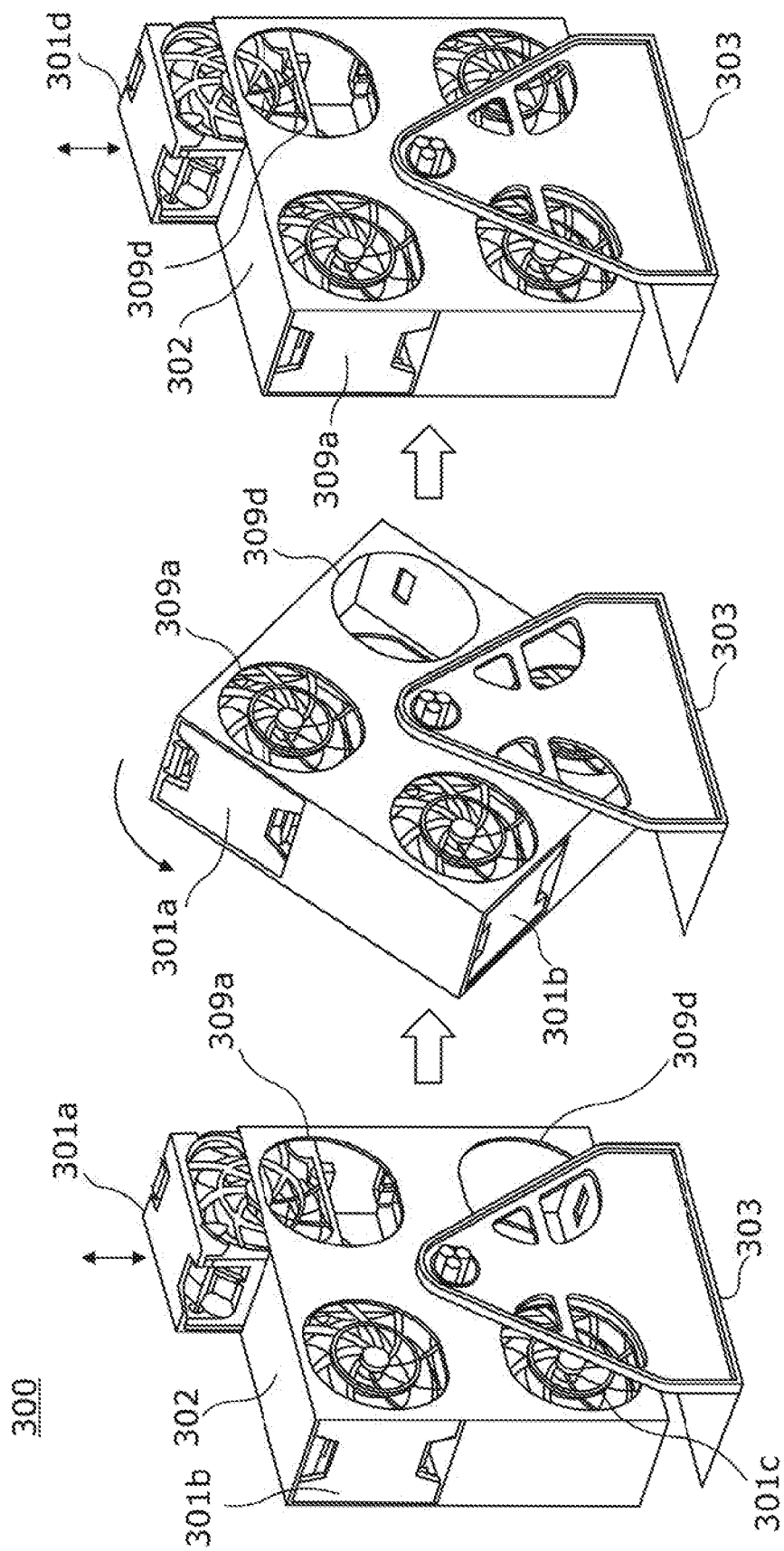

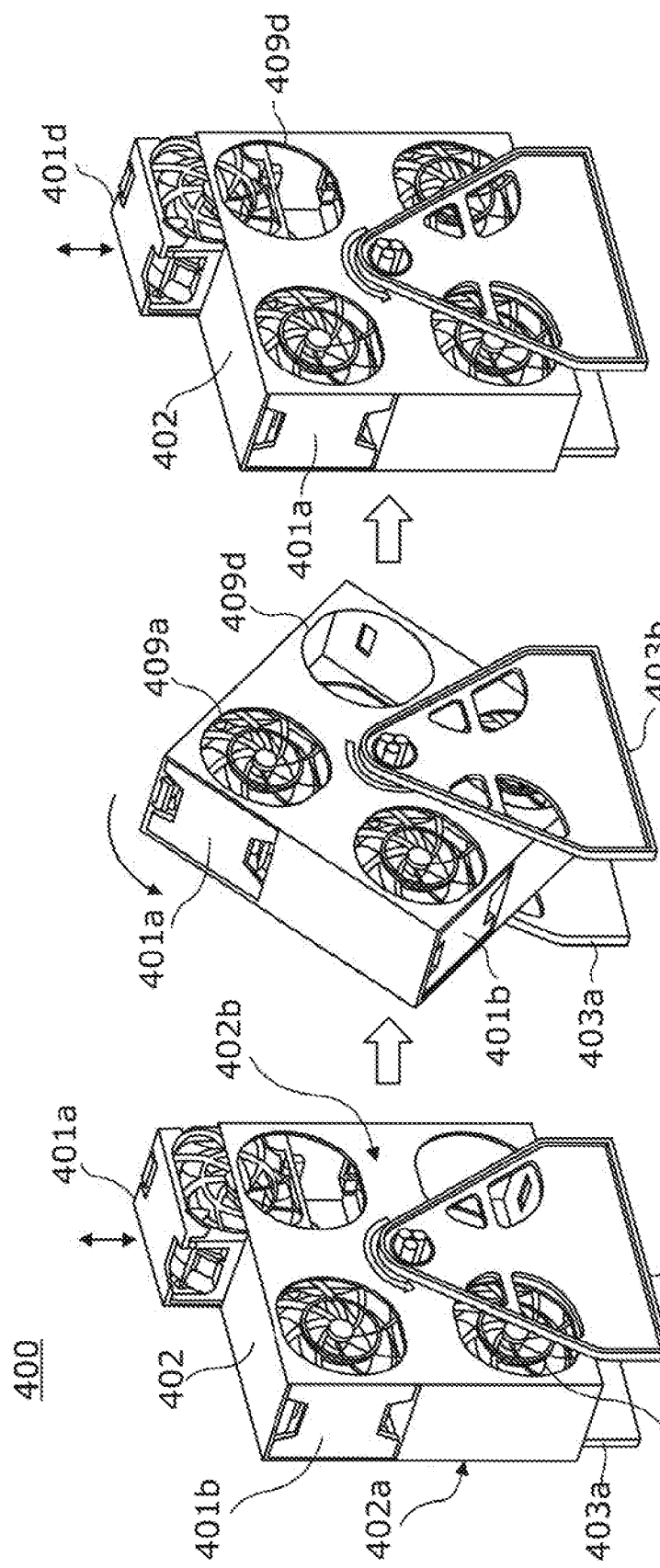

COOLING SYSTEMS

BACKGROUND

Server systems are generally shaped and sized based on industry standards. To maximize storage capacity of servers, storage devices are tightly packed side by side within an enclosure. Such servers have very little space for air movement between each storage device. Thus, it will be understood that placing a large number of storage devices close together can introduce cooling issues. Furthermore, storage devices may require independent cooling which should not be interrupted due to the manipulation of a cooling system designed to overcome the cooling issues. Hence, an efficient cooling system that solves the mentioned drawbacks is desired.

BRIEF DESCRIPTION OF THE DRAWINGS

FIGS. 1A and 1B illustrate an example of a cooling system according to the present disclosure.

FIGS. 3A, 3B and 3C illustrate an example of a cooling system according to the present disclosure.

FIGS. 4A, 4B and 4C illustrate another example of a cooling system according to the present disclosure.

DETAILED DESCRIPTION

Figures 2A, 2B:
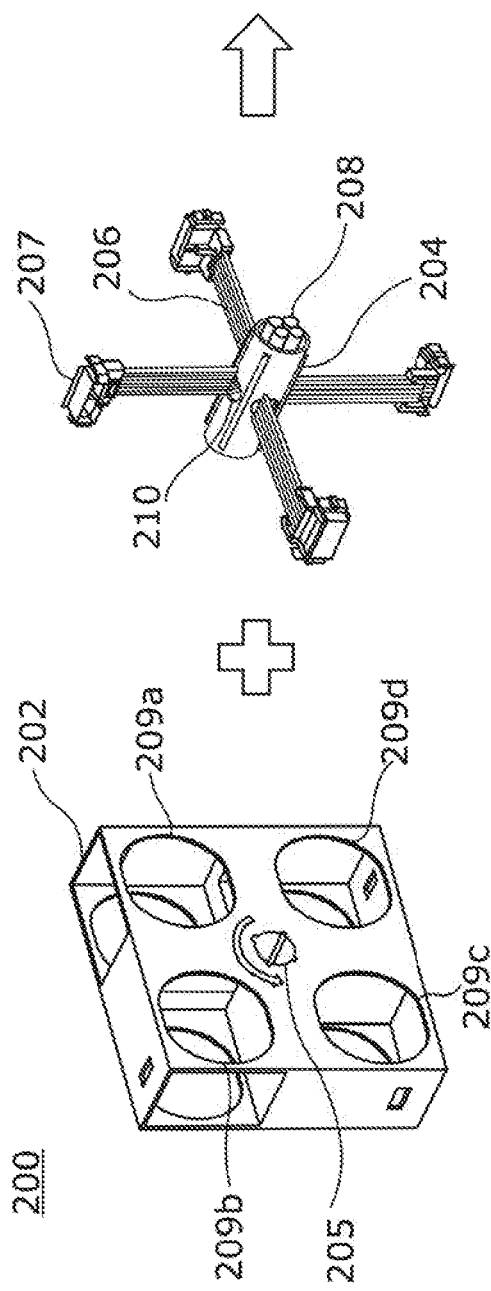
FIGS. 2A and 2B illustrate elements of an example of a cooling system according to the present disclosure.

Many servers utilize conventional cooling systems to remove the heat from disk drives and controlling electronics. Such cooling systems are designed to move a large volume of air across or throughout the server in order to remove the heat energy created by the operation of the server.

Effective air flow mass movement generally requires open spaces between and around storage drives and surrounding electronics throughout the server system. Examples of server systems can be e.g. a modular server as a rack server. At the same time, it should be desirable to have size efficient enclosures where the volume of the enclosure is minimized as much as possible and that could permit the replacement of a faulty fan without interrupting the enclosure and the functioning of other devices. The present disclosure proposes a cooling system that at least solves the aforementioned drawbacks.

FIG. 1A shows a front view of an example of a cooling system 100 according to the present disclosure. The cooling system 100 comprises a fan cage 102, the fan cage 102 comprises a cavity 105 on its central axis, a support bracket 103 and a bush 104. The bush 104 comprises a first end 104a. The support bracket 103 can support the fan cage 102 such that the fan cage rotates on its central axis. The central axis of the fan cage may be located in the middle length and width of the square fan cage. In this example, the fan cage 102 is a square fan cage. In some implementations, the fan cage 102 can have other shapes, as e.g. a rectangle, pentagon, hexagon, etc. The selected shape of the fan cage may permit the rotation of the fan cage on its central axis.

FIG. 1B shows a rear view of the cooling system 100 comprising a plurality of adjacent fan modules 101. The plurality of adjacent fan modules 101 can be configured to generate a plurality of independent cooling flows. The fan cage 102 having a central axis can contain the plurality of adjacent fan modules 101. The bush 104 is established in the cavity 105 of the fan cage 102 as shown in FIG. 1B. The first end 104a of the bush 104 engages the support bracket 103 on a surface 102a of the fan cage 102.

The cooling system 100 can be used to cool devices as storage drives. The storage drives can include solid state drives (SSDs), hard disk drives, etc. The storage drives can be contained in an enclosure as e.g. a storage server system. These types of enclosures can store a large number of devices that must to be cooled to work properly. Hence, the present disclosure also relates to a server system comprising a plurality of devices cooled by a cooling system as the example shown in FIG. 1B.

FIG. 2A shows elements of an example of a cooling system 200 according to the present disclosure. FIG. 2A shows a fan cage 202 having a central axis and comprising four compartments 209a to 209d that can contain four fan modules (not shown). Furthermore, the fan cage 202 comprises a cavity 205 located in the central axis of the fan cage 202.

FIG. 2A also shows four electrical cables 206 (e.g. fan cables) attached to four electrical connectors 207, respectively. The electrical cables 206 can connect the fan modules via the electrical connectors 207 to a computing device (not shown) to the cooling system 200. An example of a computing device can be e.g. a storage server.

The cooling system 200 further shows a bush 204 comprising a hollow cavity that can contain a junction point 208 of the electrical cables 206. Furthermore the bush 204 comprises four holes 210 established on the bush surface to route the electrical cables 206 outside the bush 204.

FIG. 2A shows the electrical cables 206 inserted in the bush 204. The integration of the electrical cables 206 and the bush 204 with the fan cage 202 is also shown in FIG. 2A. The power supply can be provided by a power source located in a storage server that includes the cooling system 200. The power can be supplied by external electrical cables through the bush 204 where the electrical cables 206 are established and routed along the fan cage 202.

FIG. 2B shows the same example cooling system 200 of FIG. 2A but with cage 202 being transparent. The transparent cage shows a plurality of channels that for in this particular example form they form a cross-shaped channel 211 located inside the fan cage 202. The crops-shaped channel 211 routes the electrical cables 206 through the fan cage 202 as it can be seen in the integration of the electrical cables 206 and the bush 204 with the fan cage 202 and the cross-shaped channel 211 in FIG. 2B.

FIGS. 3A to 3C show a cooling system 300 comprising a fan cage 302 with four compartments 309a to 309d that can allocate four fan modules 301a to 301d, respectively. FIG. 3A shows how the fan module 301a is installed into the compartment 309a. The compartment 309a has an access point or entrance that permits the installation or removal of the fan module 301a. The installation of the fan module 301a can be carried out without interrupting the enclosure of other fan modules 301b to 301d allocated in the fan cage 302 and without interrupting the functioning of e.g. a modular server being serviced by the cooling system.

FIG. 3B shows the process of rotating the fan cage 302 around the central axis of the fan cage 302 to access the compartment 309d in order to install an additional fan module 301d as shown in FIG. 3C. Hence, FIG. 3C shows that the compartment 309d can be accessed and the fan module 301d can be installed into the compartment 309d by a user or operator of the cooling system by means of rotating the fan cage 302. A first advantage of the proposed cooling system by rotating the fan cage 302 during installation of a new fan module is that none of the remaining fan modules, e.g. 301b and 301c have to be interrupted in order to install a new fan module 301d. A second advantage of the proposed cooling system by rotating the fan cage 302 during replacement of a faulty fan module is that only the faulty fan module must be interrupted in order to install a new fan module. A third advantage of the proposed cooling system is that an associated computing device as e.g. a modular server may not have to be interrupted during replacement, installation or removal of any fan module.

FIG. 4 shows another example of a cooling system 400 according to the present disclosure. The cooling system 400 comprises a fan cage 402 having a first surface 402a and a second surface 402b and a central cavity that allocates a bush (not shown). The cooling system 400 further comprises a first support bracket 403a that can engage a first end of a bush on the first surface 402a. The cooling system 400 further comprises a second support bracket 403b that can engage a second end of the bush on the second surface 402b of the fan cage 402.

The rotation capabilities of the proposed fan cages shown in FIGS. 1 to 4 permit that any fan module can be installed, removed or replaced without interrupting the enclosure and functioning of other fan modules allocated in the fan cage and the functioning of a device e.g. a modular server associated and/or being serviced by the cooling system.

Figure 5:
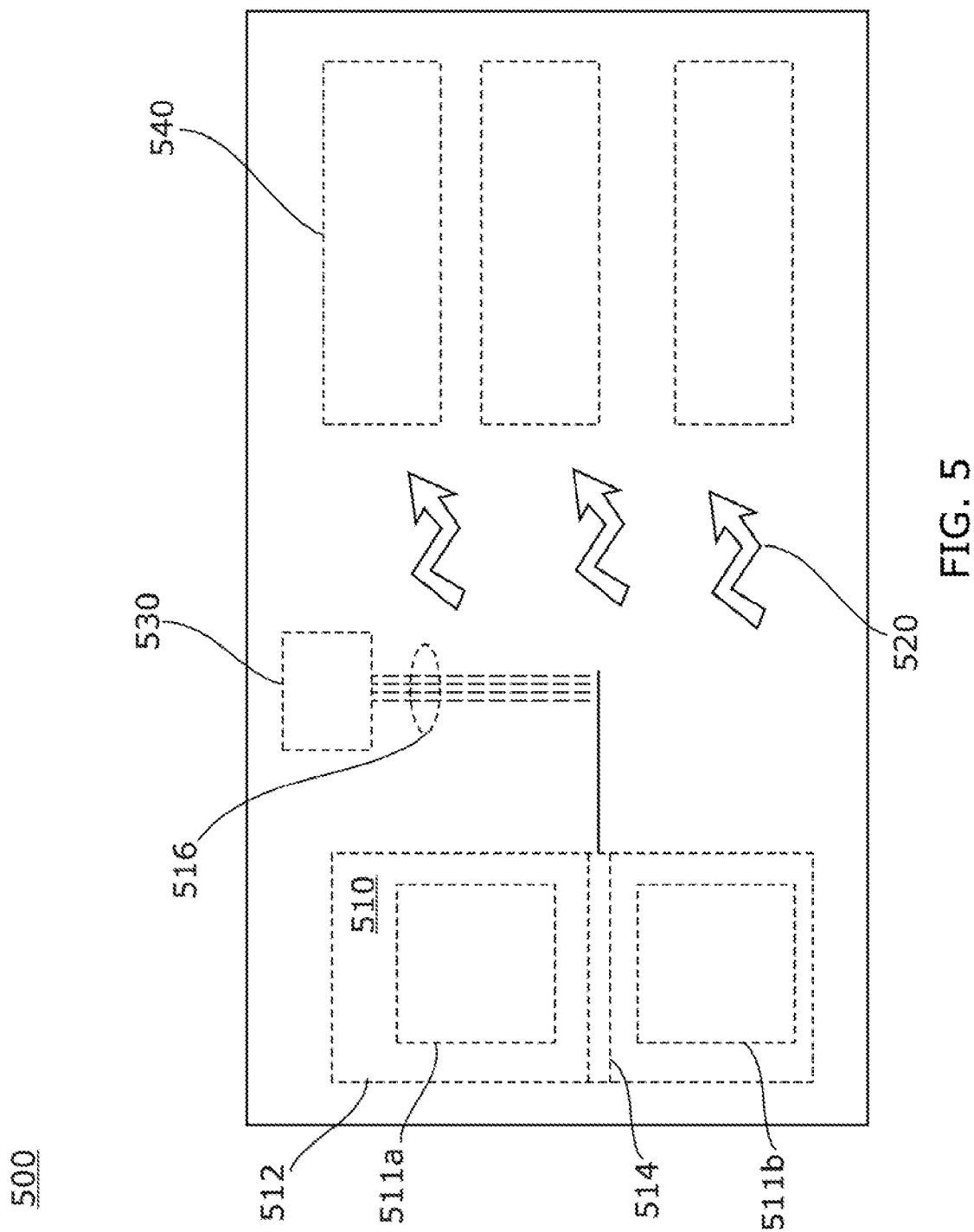
FIG. 5 illustrates an example of a system according to the present disclosure.

FIG. 5 shows a top view of a system 500 comprising a cooling system 510 and devices 540. The devices 540 can include storage drives as e.g. hard drives, solid state drives (SSD), and/or other components that generate heat (e.g., a processor, memory, etc.). The server system 500 comprises an example of a cooling system 510 as shown in the previous figures and according to the present disclosure. The cooling system 510 comprises four adjacent fan modules 511 configured to generate a plurality of independent cooling flows 520 to cool the devices 540.

In particular, FIG. 5 shows a top view of the cooling system 510 comprising fan modules 511a and 511b within a fan cage 512. The cooling system 510 comprises a fan cage 512 having a central axis. The fan cage 512 can contain the fan modules 511. Furthermore, the fan cage 512 comprises a cavity on its central axis. A support bracket not shown can support the fan cage 512 such that the fan cage rotates on its central axis.

Furthermore, a bush 514 is established in the cavity of the fan cage 512. A part of the bush 514 can engage the support bracket to permit the fan cage 512 to rotate. A plurality of electrical cables 516 from a power source 530 can power the fan modules 511 via the bush 514. In some implementations, the server system can be a modular server as a rack server. In some implementations, the cooling system can further comprise a second support bracket, wherein a part of the bush 514 is adapted to engage the second support bracket.

Figure 6:
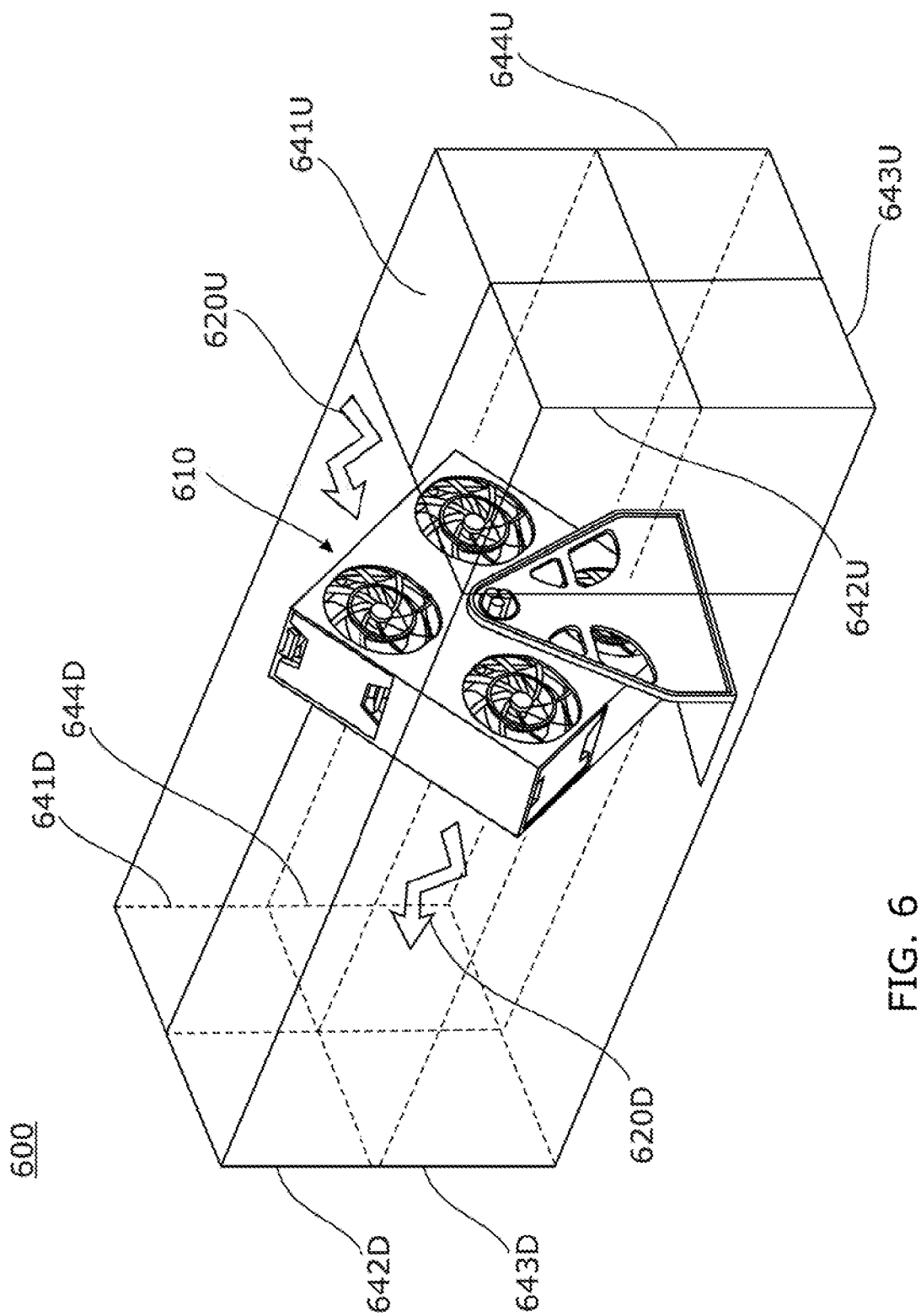
FIG. 6 illustrates an example of a cooling system according to the present disclosure.

FIG. 6 shows an example of a cooling system 600 according to present disclosure. The cooling system 600 can generate an upstream cooling flow 620U and a downstream cooling flow 620D. The upstream cooling flow 620U can cool quadrants 641U, 642U, 643U and 644U facing a first side of the cooling system 600. The downstream cooling flow 620D can cool quadrants 641D, 642D, 643D and 644D facing a second side of the cooling system 600. Each quadrant cooled by the upstream cooling flow 620U can contain a device or an enclosure (e.g. a storage server) for several devices. Each quadrant cooled by the downstream cooling flow 620D can contain a device or an enclosure (e.g. a storage server) for several devices. The devices can comprise heat generating components such as processors, memory, voltage regulators, storage drives as e.g. hard drives, solid state drives (SSD), etc.

An advantage of the proposed cooling systems according to the present disclosure can be that the cooling system 600 can provide independent cooling to devices/enclosures located in different quadrants in the upstream cooling flow 620U and/or in the downstream cooling flow 620D. As mentioned in previous FIG. 3 during the replacement of a (faulty) fan module only the (faulty) fan module must be interrupted in order to install a new fan module in the cooling system while the remaining fan modules continue to function. Hence, the cooling of devices/enclosures located in quadrants not affected by the replacement of the (faulty) fan module and being cooled by the remaining fan modules may not be interrupted.

Figure 7:
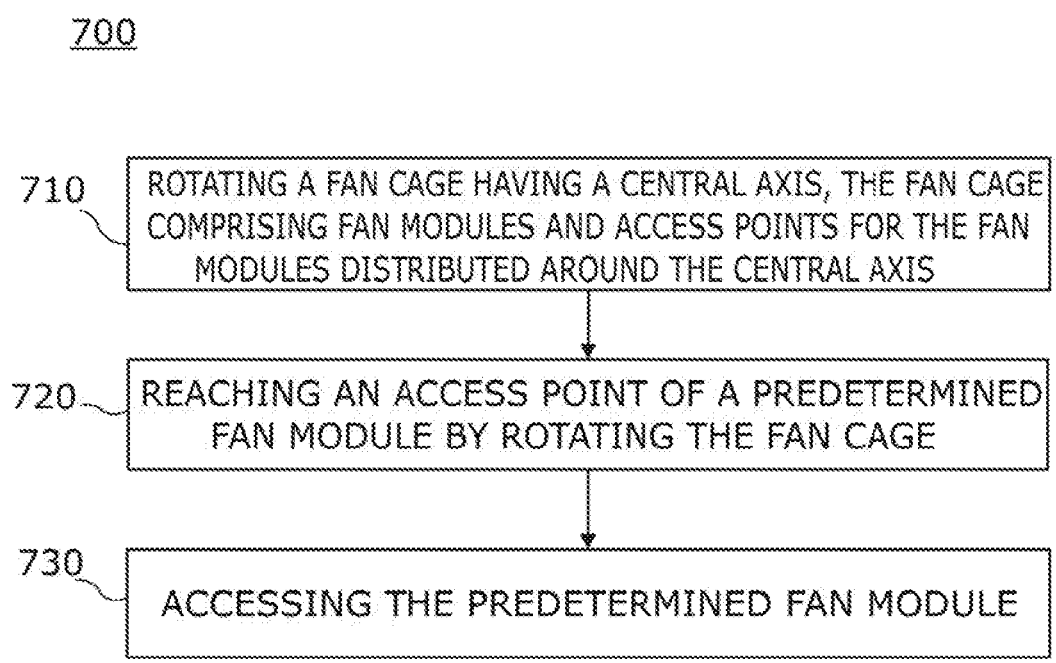
FIG. 7 illustrates an example of a flowchart for accessing a cooling system according to the present disclosure.

FIG. 7 illustrates an example of a flowchart 700 for accessing a cooling system according to the present disclosure, in particular FIG. 7 shows steps for accessing a predetermined fan module from a plurality of fan modules in a cooling system.

The flowchart 700 comprises step 710 for rotating a fan cage having a central axis, the fan cage comprising a plurality of fan modules allocated in compartments with access points or gates for accessing the fan modules. The fan modules can be distributed around the central axis of the fan cage as shown in FIGS. 3 and 4.

The flowchart 700 comprises step 720 for reaching an access point of the predetermined fan module by rotating the fan cage. Each fan module associated with a fan cable that powers the fan module.

The rotation of the fan cage is shows in FIGS. 3 and 4. The fan cage can be rotated by a user or an operator in order to access a predetermined fan module or compartment within the fan cage.

The flowchart 700 comprises step 730 for accessing the predetermined fan module. In particular, FIGS. 3C and 4C show how a particular compartment can be accessed in order to install a new fan module without interrupting the enclosure and the functioning of other fan modules or associated computing devices due to the rotation capabilities of the proposed cooling system.

Furthermore, the flowchart 700 comprises a step for removing the predetermined fan module from the fan cage via the access point. A predetermine fan module can be removed from the fan cage by accessing by rotating the fan cage and reach the predetermined fan module to be removed.

The flowchart 700 comprises a step for installing a new fan module in place of the removed predetermined fan module via the access point by attaching the fan cable of the removed fan module to the new fan module. In an example, the predetermined fan module is a faulty fan module. A faulty fan module can be removed and a new fan module can be installed or inserted into a free compartment within the fan cage according to the examples of cooling systems shown in the present disclosure.

Furthermore, relative terms used to describe the structural features of the figures illustrated herein are in no way limiting to conceivable implementations. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

What is claimed:

1. A cooling system, the system comprising:
    a plurality of adjacent fan modules configured to generate a plurality of cooling flows;
    a fan cage having a central axis adapted to contain the plurality of adjacent fan modules each directing air in a direction parallel to the central axis, the fan cage comprising a cavity on its central axis;
    a first support bracket adapted to support the fan cage such that the fan cage rotates each of the plurality of adjacent fan modules around the central axis; and
    a bush established in the cavity of the fan cage,
    wherein a first end of the bush is adapted to engage the first support bracket on a first surface of the fan cage.

2. The cooling system according to claim 1, further comprising a plurality of electrical cables to power the fan modules, wherein the plurality of electrical cables are routed through the bush to the fan modules.

3. The cooling system according to claim 2, wherein the fan cage comprises:
    a plurality of compartments adapted to contain the fan modules; and
    a plurality of channels adapted to route the electrical cables.

4. The cooling system according to claim 3, wherein the bush comprises:
    a hollow cavity adapted to contain a junction point of the electrical cables; and
    one or more holes established on the bush surface to route the electrical cables.

5. The cooling system according to claim 2, wherein the plurality of electrical cables comprises one or more electrical connectors.

6. The cooling system according to claim 1, wherein the plurality of adjacent fan modules comprises four fan modules.

7. The cooling system according to claim 1, further comprising a second support bracket, wherein a second end of the bush is adapted to engage the second support bracket on a second surface of the fan cage opposite to the first surface.

8. A server system, the system comprising:
    a plurality of devices;
    a cooling system comprising:
    a plurality of adjacent fan modules configured to generate a plurality of cooling flows;
    a fan cage having a central axis adapted to contain the plurality of adjacent fan modules each directing air in a direction parallel to the central axis, the fan cage comprising a cavity on its central axis;
    a first support bracket adapted to support the fan cage such that the fan cage rotates each of the plurality of adjacent fan modules around the central axis and perpendicular to the airflow produced by the fan modules; and
    a bush established in the cavity of the fan cage,
    wherein a first end of the bush is adapted to engage the first support bracket on a first surface of the fan cage; and
    a plurality of electrical cables from a power source to power the fan modules, wherein the electrical cables are routed through the bush to the fan modules,
    wherein the cooling system is adapted to cool the plurality of devices.

9. The server system of claim 8, wherein the plurality of devices are storage devices.

10. The server system of claim 8, wherein the cooling system comprises four fan modules configured to generate a plurality of independent cooling flows.

11. The server system of claim 8, wherein the cooling system further comprises one or more electrical connectors to connect the plurality of fan modules to the plurality of electrical cables.

12. The server system of claim 8, wherein the cooling system further comprises a second support bracket, wherein a second end of the bush is adapted to engage the second support bracket on a second surface of the fan cage opposite to the first surface.

13. The server system of claim 8, including an enclosure that includes the plurality of devices and the cooling system.

\* \* \* \* \*